United States Patent [19]

McNair

[11] 4,365,199
[45] Dec. 21, 1982

[54] NUCLEAR MAGNETIC RESONANCE SAMPLE TUBE INSERT

[75] Inventor: Douglas S. McNair, Houston, Tex.

[73] Assignee: Baylor College of Medicine, Houston, Tex.

[21] Appl. No.: 251,642

[22] Filed: Apr. 6, 1981

[51] Int. Cl.³ .............................................. G01N 27/00
[52] U.S. Cl. ...................................... 324/318; 324/321
[58] Field of Search ........................ 324/307, 318, 321

[56] References Cited

U.S. PATENT DOCUMENTS

| | | | |
|---|---|---|---|
| 3,548,297 | 12/1970 | Van Geet | 324/321 |
| 3,593,117 | 7/1971 | Koch | 324/321 |
| 3,796,946 | 3/1974 | Utsumi | 324/321 |

OTHER PUBLICATIONS

D. W. Sawyer et al., A Simple Sample Container for NMR Temperature Studies on Liquids, J. Phys. E. (GB), vol. 6, No. 12, (Dec. 1973), pp. 1205–1207.

*Primary Examiner*—Michael J. Tokar
*Attorney, Agent, or Firm*—Fulbright & Jaworski

[57] ABSTRACT

An insert for insertion into a circularly cross-sectioned sample tube for use in nuclear magnetic resonance spectrometry for reducing temperature variations in the sample and dispersing heat generated. The insert includes two spaced end plugs having arcuate sides to thermally mate with the interior of the sample tube. The end plugs include a venting passageway for allowing flow of fluids past the plugs when the insert is moved into and out of a sample in the tube. An elongate circular rod is positioned between and connected to the end plugs and positioned to be coaxially positioned in the sample tube. The rod has a cross-sectional area of less than the end plugs for providing an annular sample chamber when positioned in a sample tube. The end plugs and the rod are of beryllium oxide for conducting heat from and reducing temperature variations in the sample tube. The sample tube may also be of beryllium oxide. An attachment is connected to one of the plugs for inserting and removing the insert from a sample tube, and a guide is provided on the other of the plugs for guiding the insert into a tube. If desired, a heatsink grease may be positioned on the sides of the end plug for providing greater thermal transmission between the insert and the tube.

7 Claims, 3 Drawing Figures

U.S. Patent     Dec. 21, 1982     4,365,199
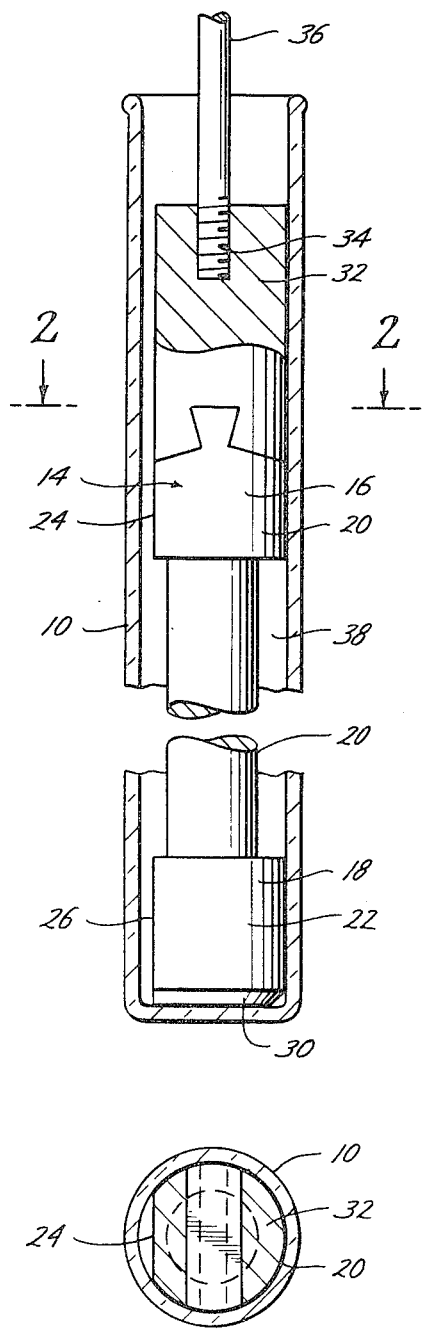
Fig. 1
Fig. 2
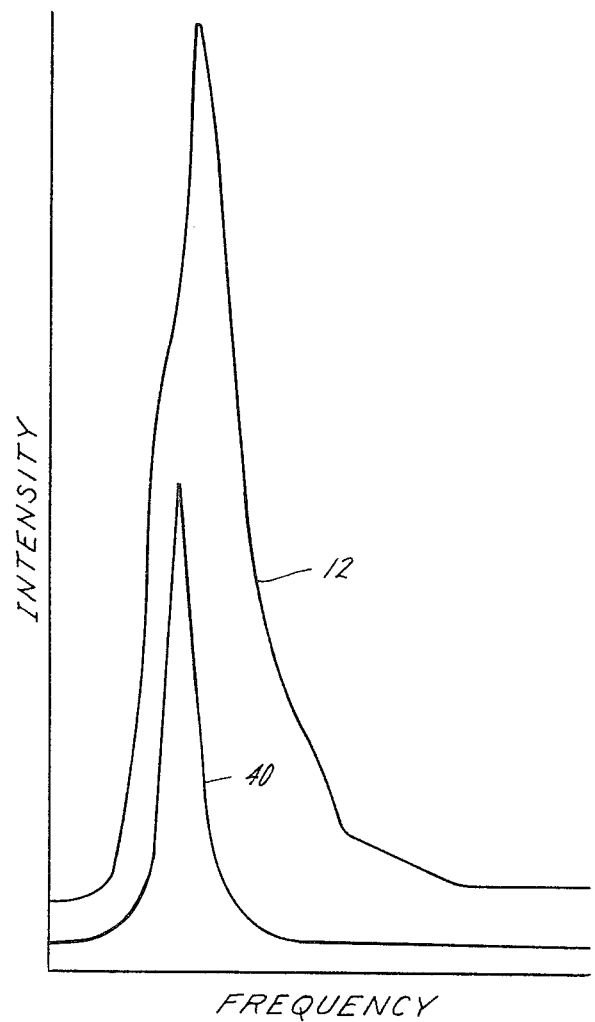
Fig. 3

NUCLEAR MAGNETIC RESONANCE SAMPLE TUBE INSERT

BACKGROUND OF THE INVENTION

Accurate measurement and control of sample temperature have long been a problem in nuclear magnetic resonance (NMR) spectroscopy. When high-power heteronuclear decoupling is used, interaction between the radiofrequency electric field and the electric dipole moments of molecules and ions in the sample causes the sample to be heated and usually increases the uncertainty of temperature measurement. In cases where the ionic conductivity of the sample is low, heat generation due to absorption of RF energy is relatively small, and errors in temperature measurements may be made correspondingly small. Heating effects become large for aqueous solutions of high ionic strength and the temperature at various locations in the active volume of the sample may be far from uniform.

Heating effects are of special concern in dynamic NMR studies of rate processes and chemical equilibria. Dipolar relaxation rates and NOEs in systems where molecular reorientation is cooperative may also be sensitive to temperature dispersion arising from RF heating. Determinations of rotational correlation times and conformer distribution in biopolymer or liquid-crystalline lipid systems thus require that temperature be highly uniform and time-invariant throughout the active volume and that it be known accurately.

The present invention is directed to an improved insert for use in a sample tube for reducing the effects of radio frequency heating on the sample temperature.

SUMMARY

The present invention relates to a sample tube insert for use in NMR spectorscopy. When high power radiofrequency irradiation is applied to sample specimens having high dielectric loss in a spectroscopic probe, the rate of internal generation of heat in such specimens is considerable. This produces undesired heat and undesired temperature gradients in the sample. The present invention consists of an insert of beryllium oxide which reduces temperature variations in the sample and disperses heat generated in the sample.

It is an object of this invention to provide a beryllium oxide insert for positioning in a circularly cross-sectioned sample tube for use in nuclear magnetic resonance in which the insert includes two spaced end plugs having arcuate sides to be positioned in a heat exchange relationship adjacent the inner surface of the sample tube when inserted therein. The end plugs include venting means for allowing the passage of fluids when the insert is moved into or removed from a sample tube having a sample. An elongate circular rod is positioned between and connected to the end plugs and positioned to be coaxially positioned in the sample tube. The rod has a cross-sectional area of less than the end plugs and the interior of the sample tube for providing an annular sample chamber. The insert will conduct heat from and reduce temperature variations in the sample tube.

Another object of the present invention is the provision of attachment means connected to one of the plugs for inserting and removing the insert from a sample tube.

Still a further object of the present invention is the provision of a guide surface on one of the plugs on its end remote from the rod for aiding in inserting the insert into the sample tube.

A still further object is the combination of the insert of the present invention with a sample tube comprised of beryllium oxide.

Yet a still further object includes the provision of a heatsink grease positioned on the sides of the end plugs for providing thermal contact with the tube when inserted.

Other and further objects, features and advantages will be apparent from the following description of a presently preferred embodiment of the invention, given for the purpose of disclosure and taken in conjunction with the accompanying drawings.

BRIEF DESCRIPTION OF THE DRAWINGS

FIG. 1 is an elevational view, in cross section, of the preferred embodiment of the insert of the present invention, FIG. 2 is a cross-sectional view taken along the line 2—2 of FIG. 1, and FIG. 3 is a graph illustrating the different results obtained from the present invention as compared with conventional equipment.

DESCRIPTION OF THE PREFERRED EMBODIMENT

Referring now to the drawings and particularly to FIG. 1, a circularly cross-sectioned sample tube 10, which contains a sample to be tested, is conventionally placed in an NMR probe and rotated. However, when high power radiofrequency irradiation is applied to a specimen having high dielectric loss in the tube 10 the amount of internal generation of heat in the specimen is considerable and undesired temperature gradients in the specimen are created. Radiofrequency heating of a sample not only alters the spatial distribution of heat generation in the probe but also affects the rate of convective transfer at the tube and probe surfaces. For example, and referring to FIG. 2, the graph 12 of the spectra obtained using a 12 mm glass sample tube 10 gave characteristic distorted lines with a width up to 2.5 Hz. Gradients of this size would be unacceptable in many of the applications where NMR is a favored or, occasionally, the only applicable technique for measurement. One method of minimizing the radial temperature gradients encountered is to reduce the cross section of the active volume of the tube 10 and thus of the sample. For example, by using a 1.2 mm capillary tube temperature effects are reduced, but in this event the sensitivity becomes undesirably low.

The present invention is directed to providing an insert generally referred to by the reference numeral 14 which provides both improved sensitivity and smaller temperature gradients. The insert 14 includes first and second spaced end plugs 16 and 18 and an elongate circular connecting rod 20. The insert 14 is generally cylindrical whereby the end plugs 16 and 18 have arcuate sides 20 and 22, respectively, which have a sliding fit when placed inside of the sample tube 10 of matching inside diameter whereby the sides 20 and 22 are in thermal and mechanical contact with the inner surface of the sample tube 10. The end plugs 16 and 18 have a venting passageway 24 and 26, respectively, such as by milling off one side of the plugs 16 and 18 which allow axial flow of liquids and gas in the tube 10 as the insert 14 is inserted or withdrawn from the tube 10.

Preferably, the lower end of the lower plugs 18 includes a guide surface 30 such as a chamfer for guiding and relieving any stress as the insert 14 is moved in the sample tube 10. Suitable attachment means are provided connected to the top end plug 16 such as a removable plastic connector 32 made out of any suitable material such as nylon and provided with a threaded hole 34 for connection to a threaded rod 36 for inserting and extracting the insert 14 from the tube 10.

The rod 20 is specially machined to a diameter as will create an annular cavity 38 inside of the sample tube 10, of a volume sufficiently large to provide a detectable NMR signal when occupied by a specimen, but of a radial cross section sufficiently small to provide a small temperature variation in the radial direction. The axial dimensions and tolerances of the insert 14 depend upon the size of the particular NMR probe and sample tube 10 with which the insert 14 is to be used and are selected so as to maximize the filling factor and minimize line broadening arising from magnetic field inhomogeneities. Preferably, the camber and concentricity are provided to be 0.001 inches or better and the surface finish of the exterior of the insert 14 is preferably approximately 32 microinches arithmetic-average or better.

The end plugs 16 and 18 and the rod 20 are manufactured from dense, polycrystalline beryllium oxide which has a conductivity of $2.72$ $W.cm^{-1}.°K^{-1}$ providing a low loss dielectric whose thermophysical properties are outranked only by those of diamond (which is too expensive to be practicable), and is comparable to those of metallic copper (which is not satisfactory because of its metallic properties). If desired, a suitable heatsink grease having $k(309° K) = 6.09 \times 10^{-2} W.cm^{-1}.°K^{-1}$ conductivity may be applied to the outer surfaces 20 and 22 of the plugs 16 and 18 to establish a better thermal contact at the end of each of the end plugs 16 and 18 with the tube 10. In addition, if desired, the tube 10 may be made of beryllium oxide to enhance the rate of thermal equilibration as compared to a glass tube 10.

Referring now to FIG. 2, a representative spectrograph 40 is provided utilizing the insert 14 of the present invention. The advantage of the present invention is noted by comparing the graph 40 with the graph 12 which is both more uniform and has a narrower width providing an increased resolution over the conventional method.

The present invention provides spectral resolution in proportion to the precision of its construction, as well as excellent sensitivity and signal to noise ratio as compared to only glass tubes for any given value of the radial temperature gradient.

While there is little advantage to using the insert 14 in studying samples whose dielectric loss is small, the present insert is particularly useful in a wide range of applications involving conductive samples and should prove especially useful in biochemical studies and in work at super conducting fields.

The present invention, therefore, is well adapted to carry out the objects and attain the ends and advantages mentioned as well as others inherent therein. While a presently preferred embodiment of the invention has been given for the purpose of disclosure, numerous changes in the details of construction, and arrangement of parts will be readily apparent to those skilled in the art and which are encompassed within the spirit of the invention and the scope of the appended claims.

What is claimed is:

1. An insert for insertion into a circularly cross-sectioned sample tube for use in nuclear magnetic resonance spectrometry comprising, two spaced end plugs, said plugs having arcuate sides to be positioned in a heat exchange relationship adjacent the inner surface of sample tube when inserted therein, said end plugs having venting means for allowing the passage of fluids when the insert is moved into a sample tube having a sample, an elongate circular rod positioned between and connected to said end plugs, and said end plugs and rod being of beryllium oxide.

2. The apparatus of claim 1 including attachment means connected to the top plug for inserting and removing the insert from a sample tube.

3. The combination of claim 1 with a sample tube comprised of beryllium oxide.

4. The apparatus of claim 1 including a heatsink grease positioned on the sides of the end plugs for providing a thermal contact with the tube when inserted.

5. The apparatus of claim 1 wherein one of the plugs includes a guide surface on its end remote from the rod.

6. An insert for insertion into a circularly cross-sectioned sample tube for use in nuclear magnetic resonance spectrometry for reducing temperature variations in the sample and dispersing heat generated therein comprising, two spaced end plugs, said plugs having arcuate sides to mate with the interior of the sample tube for providing thermal transmission when the insert is inserted into the tube, said end plugs having a venting passage for allowing flow of fluids pass the plugs when the insert is moved into a sample in the tube, an elongate circular rod positioned between and connected to said end plugs and positioned to be coaxially positioned in the sample tube, said rod having a cross-sectional area of less than the end plugs for providing an annular sample chamber when positioned in a sample tube, and said end plugs and said rod being of beryllium oxide for conducting heat from and reducing temperature variations in the sample tube.

7. The apparatus of claim 6 including, attachment means connected to one of the plugs for inserting and removing the insert from a sample tube, and guide means on other of said plugs for guiding the insert into a tube.

* * * * *